United States Patent
Tseng et al.

(10) Patent No.: US 12,476,157 B2
(45) Date of Patent: Nov. 18, 2025

(54) SEMICONDUCTOR PACKAGES AND METHOD OF MANUFACTURING THE SAME

(71) Applicant: Taiwan Semiconductor Manufacturing Company, Ltd., Hsinchu (TW)

(72) Inventors: Shih-Hao Tseng, Hsinchu (TW); Hung-Jui Kuo, Hsinchu (TW); Ming-Che Ho, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 87 days.

(21) Appl. No.: 17/243,441

(22) Filed: Apr. 28, 2021

(65) Prior Publication Data
US 2022/0352046 A1     Nov. 3, 2022

(51) Int. Cl.
| | |
|---|---|
| *H01L 23/48* | (2006.01) |
| *H01L 21/56* | (2006.01) |
| *H01L 23/31* | (2006.01) |
| *H01L 23/36* | (2006.01) |
| *H01L 25/065* | (2023.01) |

(52) U.S. Cl.
CPC .............. *H01L 23/31* (2013.01); *H01L 21/56* (2013.01); *H01L 23/36* (2013.01); *H01L 25/0657* (2013.01)

(58) Field of Classification Search
CPC ........ H01L 2225/06503–06596; H01L 25/117; H01L 25/0756; H01L 25/074; H01L 25/0657; H01L 25/043; H01L 23/34–4735; H01L 23/3185; H01L 23/367; H01L 23/5384; H01L 23/5385; H01L 23/5386; H01L 23/49811; H01L 23/49816; H01L 23/31; H01L 23/481; H01L 23/49827; H01L 23/528
See application file for complete search history.

(56) References Cited

U.S. PATENT DOCUMENTS

| | | | |
|---|---|---|---|
| 6,577,013 B1 * | 6/2003 | Glenn | ..................... H01L 23/36 |
| | | | 257/E23.101 |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 * | 10/2016 | Tsai | ..................... H01L 21/6835 |

(Continued)

*Primary Examiner* — Ajay Ojha
*Assistant Examiner* — Tsz K Chiu
(74) *Attorney, Agent, or Firm* — JCIPRNET

(57) ABSTRACT

A semiconductor package includes a first integrated circuit, a first passivation layer, a second passivation layer, a thermal pattern, an adhesive layer and a second integrated circuit. The first integrated circuit is encapsulated by an encapsulant. The first passivation layer is disposed over the first integrated circuit and the encapsulant. The second passivation layer is disposed over the first passivation layer. The thermal pattern is disposed in the first passivation layer and the second passivation layer. The adhesive layer is disposed over the second passivation layer and in direct contact with the thermal pattern. The second integrated circuit is adhered to the first integrated circuit through the adhesive layer.

20 Claims, 15 Drawing Sheets

(56) References Cited

U.S. PATENT DOCUMENTS

| | | | |
|---|---|---|---|
| 9,496,189 B2 | 11/2016 | Yu et al. | |
| 9,666,502 B2 | 5/2017 | Chen et al. | |
| 9,735,131 B2* | 8/2017 | Su | H01L 25/50 |
| 10,032,734 B2* | 7/2018 | Huang | H01L 23/49866 |
| 10,083,949 B2* | 9/2018 | Jeng | H01L 25/50 |
| 10,157,835 B2* | 12/2018 | Yu | H01L 23/5389 |
| 10,177,115 B2* | 1/2019 | Yu | H01L 21/76877 |
| 10,283,479 B2* | 5/2019 | Huang | H01L 24/73 |
| 10,461,069 B2* | 10/2019 | Lin | H01L 25/0657 |
| 10,504,852 B1* | 12/2019 | Chen | H01L 25/0657 |
| 10,504,873 B1* | 12/2019 | Chen | H01L 23/5226 |
| 10,510,629 B2* | 12/2019 | Chen | H01L 23/16 |
| 10,546,845 B2* | 1/2020 | Shen | H01L 24/24 |
| 10,679,947 B2* | 6/2020 | Wang | H01L 24/20 |
| 10,685,937 B2* | 6/2020 | Chen | H01L 21/6835 |
| 10,720,401 B2* | 7/2020 | Ting | H01L 23/5386 |
| 10,734,348 B2* | 8/2020 | Yu | H01L 24/03 |
| 10,790,254 B2* | 9/2020 | Huang | H01L 21/563 |
| 11,637,089 B2* | 4/2023 | Choi | H01L 23/367 |
| | | | 257/773 |
| 2001/0030059 A1* | 10/2001 | Sugaya | H01L 21/56 |
| | | | 257/E23.125 |
| 2008/0032448 A1* | 2/2008 | Simon | H01L 21/76898 |
| | | | 438/107 |
| 2009/0045487 A1* | 2/2009 | Jung | H01L 23/3677 |
| | | | 361/717 |
| 2009/0057880 A1* | 3/2009 | Baek | H01L 25/0657 |
| | | | 257/713 |
| 2009/0294947 A1* | 12/2009 | Tain | H01L 25/0657 |
| | | | 257/713 |
| 2012/0038045 A1* | 2/2012 | Lee | H01L 23/3107 |
| | | | 257/737 |
| 2013/0277821 A1* | 10/2013 | Lundberg | H01L 23/36 |
| | | | 257/713 |
| 2015/0228580 A1* | 8/2015 | Chen | H01L 23/5389 |
| | | | 257/532 |
| 2015/0279825 A1* | 10/2015 | Kang | H01L 25/0657 |
| | | | 438/109 |
| 2015/0364386 A1* | 12/2015 | Yu | H01L 22/32 |
| | | | 438/15 |
| 2016/0155724 A1* | 6/2016 | Kim | H01L 21/6835 |
| | | | 257/774 |
| 2016/0204080 A1* | 7/2016 | Kim | H01L 25/50 |
| | | | 438/109 |
| 2017/0154878 A1* | 6/2017 | Kim | H01L 25/50 |
| 2017/0207205 A1* | 7/2017 | Kim | H01L 24/20 |
| 2017/0287853 A1* | 10/2017 | Kim | H01L 23/3128 |
| 2018/0130772 A1* | 5/2018 | Yu | H01L 21/4882 |
| 2018/0138137 A1* | 5/2018 | Jin | H01L 24/11 |
| 2019/0096862 A1* | 3/2019 | Yu | H01L 23/481 |
| 2019/0139853 A1* | 5/2019 | Oh | H01L 23/562 |
| 2019/0157244 A1* | 5/2019 | Hong | H01L 25/0657 |
| 2019/0198424 A1* | 6/2019 | Lam | H01L 21/486 |
| 2019/0237382 A1* | 8/2019 | Kim | H01L 24/92 |
| 2019/0333834 A1* | 10/2019 | Sung | H01L 23/49827 |
| 2019/0333837 A1* | 10/2019 | Kang | H01L 23/367 |
| 2020/0185304 A1* | 6/2020 | Chiu | H01L 23/3121 |
| 2021/0074641 A1* | 3/2021 | Sung | H01L 25/105 |
| 2021/0193555 A1* | 6/2021 | Lee | H01L 23/3128 |
| 2022/0037228 A1* | 2/2022 | Lai | H01L 23/5389 |
| 2022/0293565 A1* | 9/2022 | Shin | H01L 25/0657 |
| 2022/0367267 A1* | 11/2022 | Yu | H01L 24/03 |
| 2022/0384351 A1* | 12/2022 | Baek | H01L 23/5385 |

* cited by examiner

SEMICONDUCTOR PACKAGES AND METHOD OF MANUFACTURING THE SAME

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
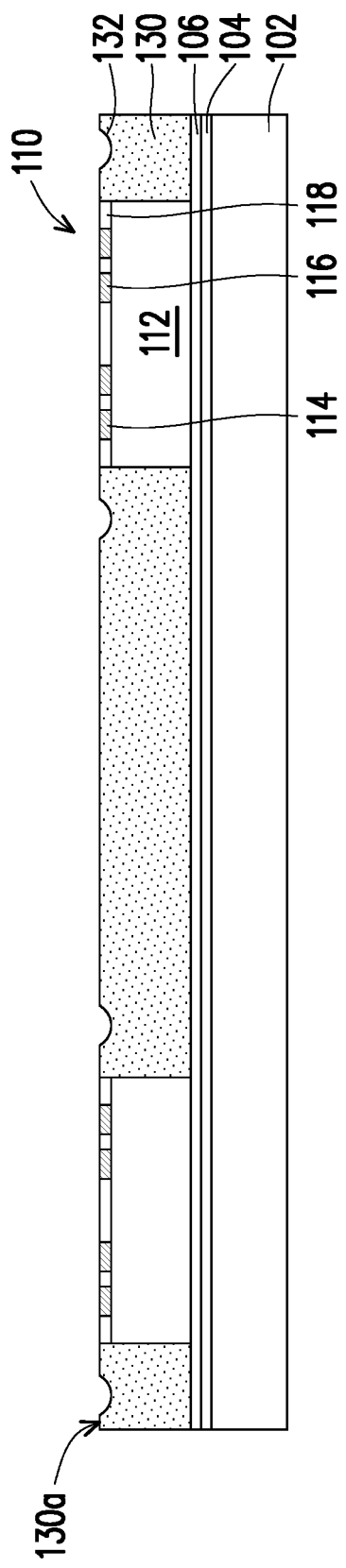
FIG. 1A to FIG. 1J are schematic cross sectional views of various stages in a method of manufacturing a semiconductor package according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1J are schematic cross sectional views of various stages in a method of manufacturing a semiconductor package according to some embodiments. In some embodiments, the semiconductor manufacturing method is part of a packaging process.

Referring to FIG. 1A, a plurality of integrated circuits 110 are disposed on a temporary carrier 102. For example, after performing a singulation process to separate individual semiconductor dies from a semiconductor wafer (not shown), the integrated circuits 110 are picked and placed on the temporary carrier 102. The temporary carrier 102 may be a glass carrier, a ceramic carrier, a metal carrier, or the like. In some alternative embodiments, the integrated circuits 110 are disposed side by side on the temporary carrier 102. In some embodiments, the integrated circuit 110 is attached onto the temporary carrier 102 through an adhesive layer 106. The adhesive layer 106 may be a die attach film (DAF) or other suitable adhesive material. In some embodiments, a de-bonding layer 104 is further formed between the temporary carrier 102 and the adhesive layer 106. In some embodiments, the de-bonding layer 104 is formed of an adhesive such as Ultra-Violet (UV) glue, Light-to-Heat Conversion (LTHC) glue, or other types of adhesives. In some embodiments, the de-bonding layer 104 is decomposable under the heat of light to release the temporary carrier 102 from the overlying structures that will be formed in subsequent steps. In some alternative embodiments, a buffer layer may be formed between the de-bonding layer 104 and the temporary carrier 102. The buffer layer may include a dielectric material layer made of a dielectric material including benzocyclobutene ("BCB"), polybenzooxazole ("PBO"), or any other suitable polymer-based dielectric material.

The integrated circuit 110 may include a semiconductor substrate 112, conductive connectors 114 and thermal patterns 116 distributed on the semiconductor substrate 112, and a protection layer 118 disposed on the semiconductor substrate 112 and surrounding the conductive connectors 114 and the thermal patterns 116 for protection. In some embodiments, the conductive connectors 114 and the thermal patterns 116 include conductive pillars, vias, bumps and/or posts made of solder, gold, copper, or any other suitable conductive materials. The conductive connectors 114 and the thermal patterns 116 may be formed by an electroplating process or other suitable deposition process. The surface where the conductive connectors 114 and the thermal patterns 116 are being distributed may be referred to as a front surface (e.g., an active surface) of the integrated circuit 110. In some embodiments, the conductive connectors 114 are used for electrical connection while the thermal patterns 116 are used for thermal dissipation. The materials of the conductive connectors 114 and the thermal patterns 116 may be the same or different. In some embodiments, materials of the conductive connectors 114 and the thermal patterns 116 include tungsten, copper, a copper alloy, aluminum, an aluminum alloy or a combination thereof. In some embodiments, a material of the protection layer 118 includes polybenzoxazole, polyimide, a suitable organic or inorganic material, or the like. In some embodiments, a thickness of the protection layer 118 is in a range of 4 μm to 8 μm. In some alternative embodiments, the protection layer 118 is formed after the integrated circuit 110 is adhered to the temporary carrier 102 and the protection layer 118 is referred to as the bottommost dielectric layer of a redistribution layer to be formed.

The integrated circuit 110 may include active components (e.g., transistors or the like) and, optionally, passive components (e.g., resistors, capacitors, inductors, etc.) formed on the semiconductor substrate 112. The integrated circuits 110 may be the same types of dies or different types of dies, and may be a logic die, such as a central processing unit (CPU) die, a graphic processing unit (GPU) die, a micro control unit (MCU) die, an input-output (I/O) die, a baseband (BB) die, or an application processor (AP) die. In some alternative embodiments, the integrated circuit 110 includes a memory die such as high bandwidth memory (HBM) die or a System-on-Die (SoC) die. In some embodiments, the integrated circuits 110 are also referred to as core dies. The integrated circuits 110 may have a thickness ranging from about 135 μm to about 155 μm. It should be appreciated that the number of the integrated circuit and the function of the integrated circuit to be packaged may depend on the design requirements.

With reference to FIG. 1A, an encapsulant 130 is formed over the temporary carrier 102 to encapsulate the integrated circuits 110. The encapsulant 130 includes a molding compound, a dielectric material such as polybenzoxazole, polyimide, benzocyclobutene, a combination thereof, or other suitable electrically insulating materials. In some embodiments, the method of forming the encapsulant 130 includes at least the following steps. An insulating material (not shown) is formed on the temporary carrier 102, so that the integrated circuits 110 are over-molded. Next, a thinning process is performed on the insulating material to reduce the thickness of the insulating material until at least a portion of the conductive connectors 114 and the thermal patterns 116 of the integrated circuits 110 are accessibly revealed. The thinning process may include a grinding process, a chemical mechanical polishing (CMP) process, and/or a planarization process, or other suitable removing process. A cleaning step is optionally performed after thinning to clean and remove the residues generated from the thinning process. After reducing the thickness of the insulating material, the encapsulant 130 is formed. However, the formation of the encapsulant 130 may be performed through any other suitable techniques, the disclosure is not intended to limit to the above description. In some embodiments, during the thinning process, the protection layer 118, the conductive connectors 114 and/or the thermal patterns 116 of the integrated circuit 110 may be slightly removed and planarized. In other words, the protection layer 118, the conductive connectors 114 and/or the thermal patterns 116 of the integrated circuit 110 may have planarized surfaces. The conductive connectors 114 and the thermal patterns 116 of the integrated circuit 110 may be accessibly revealed by the protection layer 118. The protection layer 118 of the integrated circuit 110 may at least laterally cover the conductive connectors 114 and the thermal patterns 116. In some embodiments, after forming the encapsulant 130, a surface 130a of the encapsulant 130 may be substantially coplanar with the surfaces (e.g., the front surface) of the integrated circuits 110.

In some embodiments, the encapsulant 130 includes the molding compound having at least one type of filler-containing resins. The resins are epoxy resins, phenolic resins or silicon-containing resins. The fillers may be made of non-melting inorganic materials and the fillers include metal oxide particles, silica particles or silicate particles with the average particle size ranging from about 3 μm to about 20 μm, from about 10 μm to about 20 μm or ranging from about 15 μm to about 20 μm. The surface roughness or surface flatness of the cured molding compound varies depending on fine or coarse filler particles added in the molding compound material. In some embodiments, after the thinning process such as the planarization process is performed on the encapsulant 130, some pits 132 (i.e., molding pits) are formed at the surface 130a of the encapsulant 130 due to the removal of the fillers, resulting in relatively large surface roughness or even unevenness and possible connection failure.

Figure 1B:
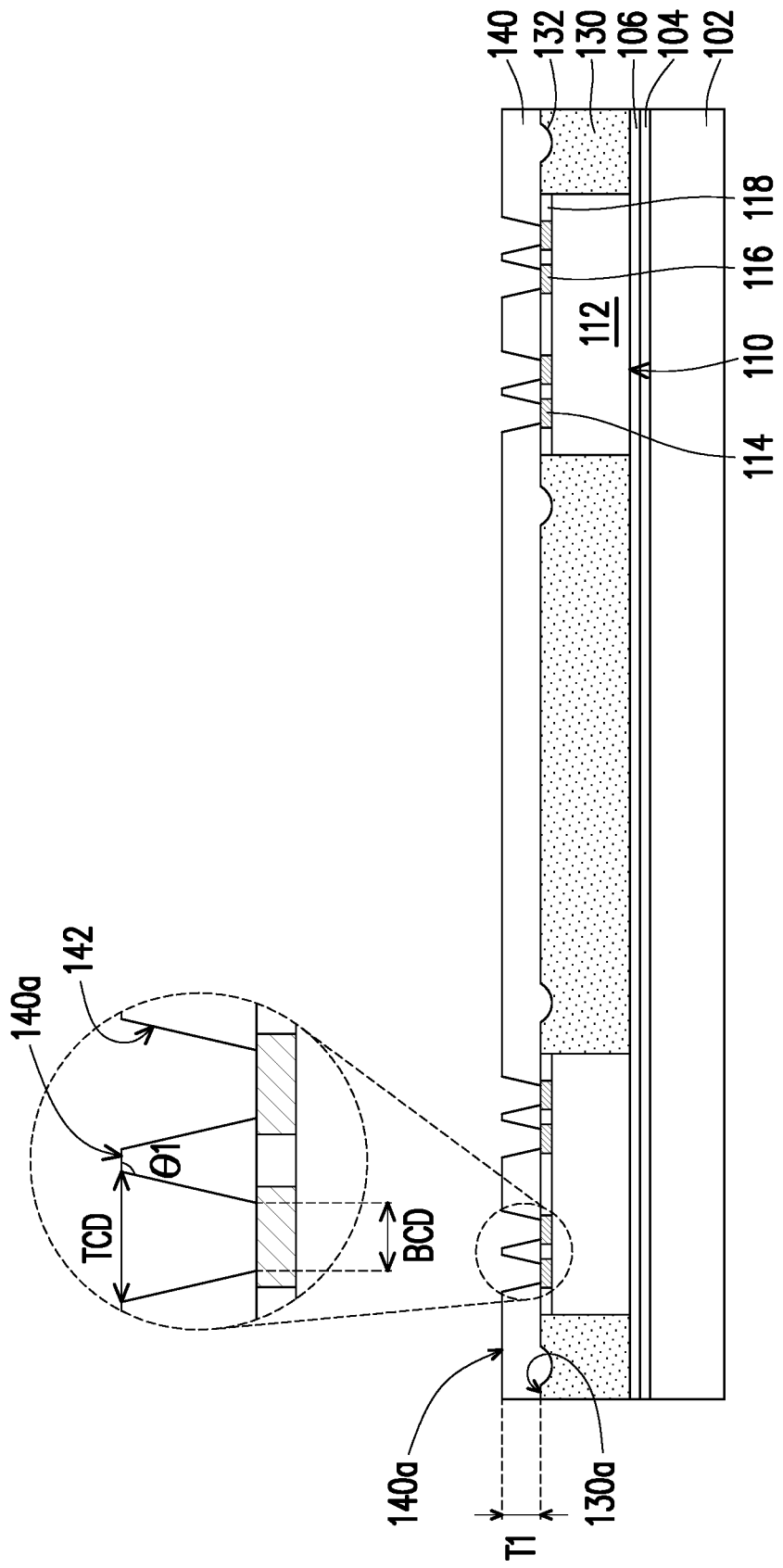

Referring to FIG. 1B, a first passivation material 140 is formed over the encapsulant 130 and the integrated circuits 110. In some embodiments, the first passivation material 140 includes a dielectric material such as polybenzoxazole, polyimide, benzocyclobutene, a combination thereof, or other suitable electrically insulating materials. In some embodiments, a thickness T1 of the first passivation material 140 is in a range of 6 μm to 8 μm. The thickness T1 of the first passivation material 140 may be larger than a thickness of the protection layer 118. In some embodiments, after forming the first passivation material 140, the pits 132 of the encapsulant 130 are filled by the first passivation material 140. Some embodiments indicate pit could not be completely filled by passivation material 140 if pit is too large or passivation material 140 THK is too thin. Some pits induce surface recess of passivation material 140 could be detected. Accordingly, a top surface 140a of the first passivation material 140 has a flatness larger than the surface 130a of the encapsulant 130. Then, a plurality of openings 142 are formed in the first passivation material 140. In some embodiments, the opening 142 has a rounding profile. For example, an included angle θ1 formed between a top surface 140a of the first passivation material 140 and a sidewall of the opening 142 is larger than or equal to about 100 degrees. A difference between a top critical dimension TCD and a bottom critical dimension BCD of the opening 142 is larger than 2 μm.

Figure 1C:
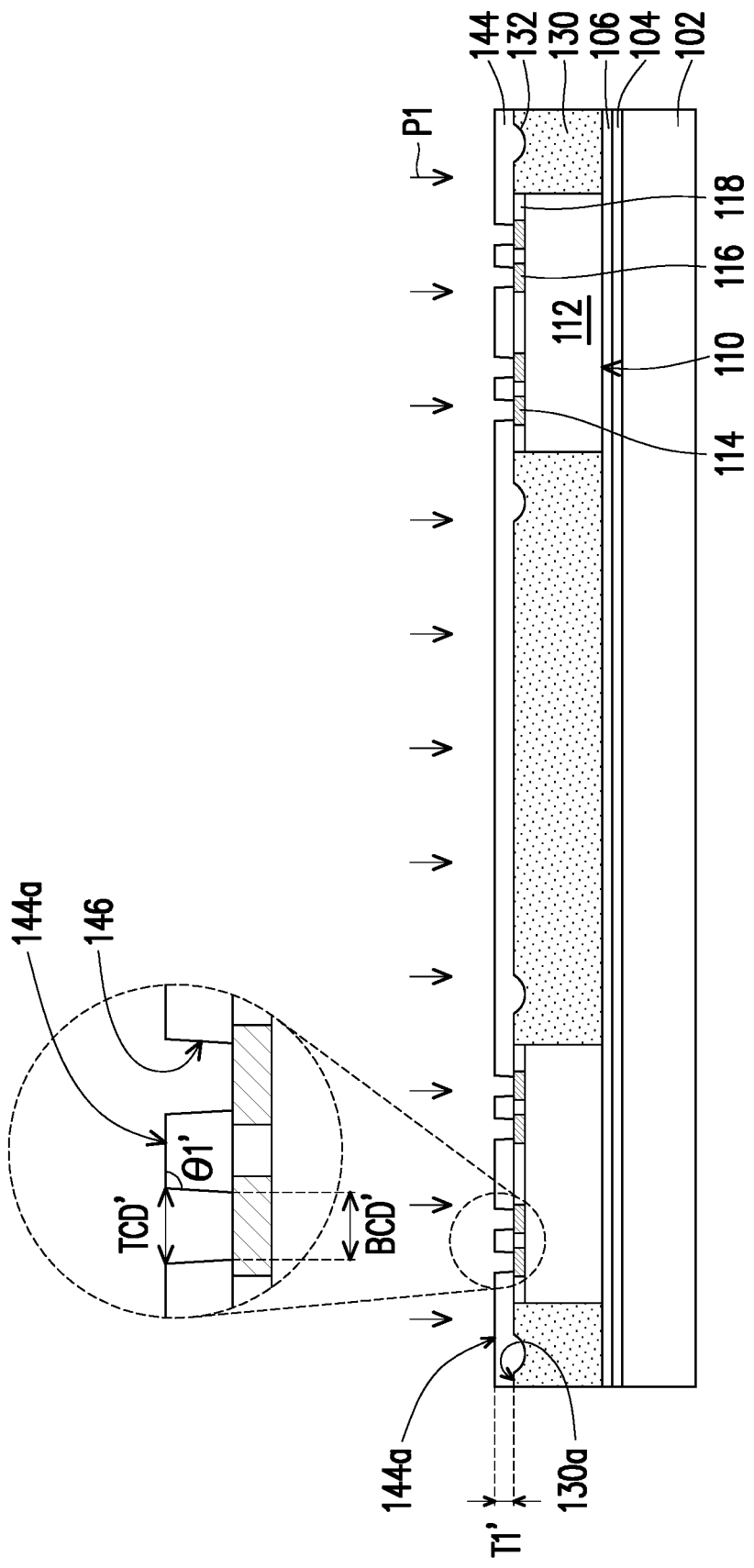

Referring to FIG. 1C, a first planarization process P1 is performed on the first passivation material 140 to remove portions of the first passivation material 140, so as to form a first passivation layer 144 and a plurality of openings 146. In some embodiments, the first planarization process P1 is chemical mechanical polishing (CMP) process or other suitable planarization process. The first planarization process P1 may remove more than ½ of the thickness T1 of the first passivation material 140. That is, a ratio of the thickness T1' of the first passivation layer 144 to the thickness T1 of the first passivation material 140 may be smaller than ½. And surface recess of passivation layer 144, which is induced by pit, can also be eliminated by suitable planarization process. For example, after performing the first planarization process P1, the first passivation layer 144 has a thickness T1 in a range of 0.5 μm to 4 μm. In some embodiments, the first passivation layer 144 has a thickness T1 not larger than 1 μm. In addition, the first passivation layer 144 may have a top surface 144a (substantially) without pits thereon. The surface roughness or surface flatness of the first passivation layer 144 is smaller than the surface roughness or surface flatness of the encapsulant 130. In some embodiments, after performing the first planarization process P1, the opening 146 has more vertical sidewalls. For example, an included angle θ1' formed between the top surface 144a of the first passivation layer 144 and a sidewall of the opening 146 is in a range of about 90 degrees to about 95 degrees, and a difference between a top critical dimension TCD' and a bottom critical dimension BCD' of the opening 146 is less than 0.5 μm. The first passivation layer 144 is in direct contact with the encapsulant 130 to fills the pits of the encapsulant 130.

Figure 1D:
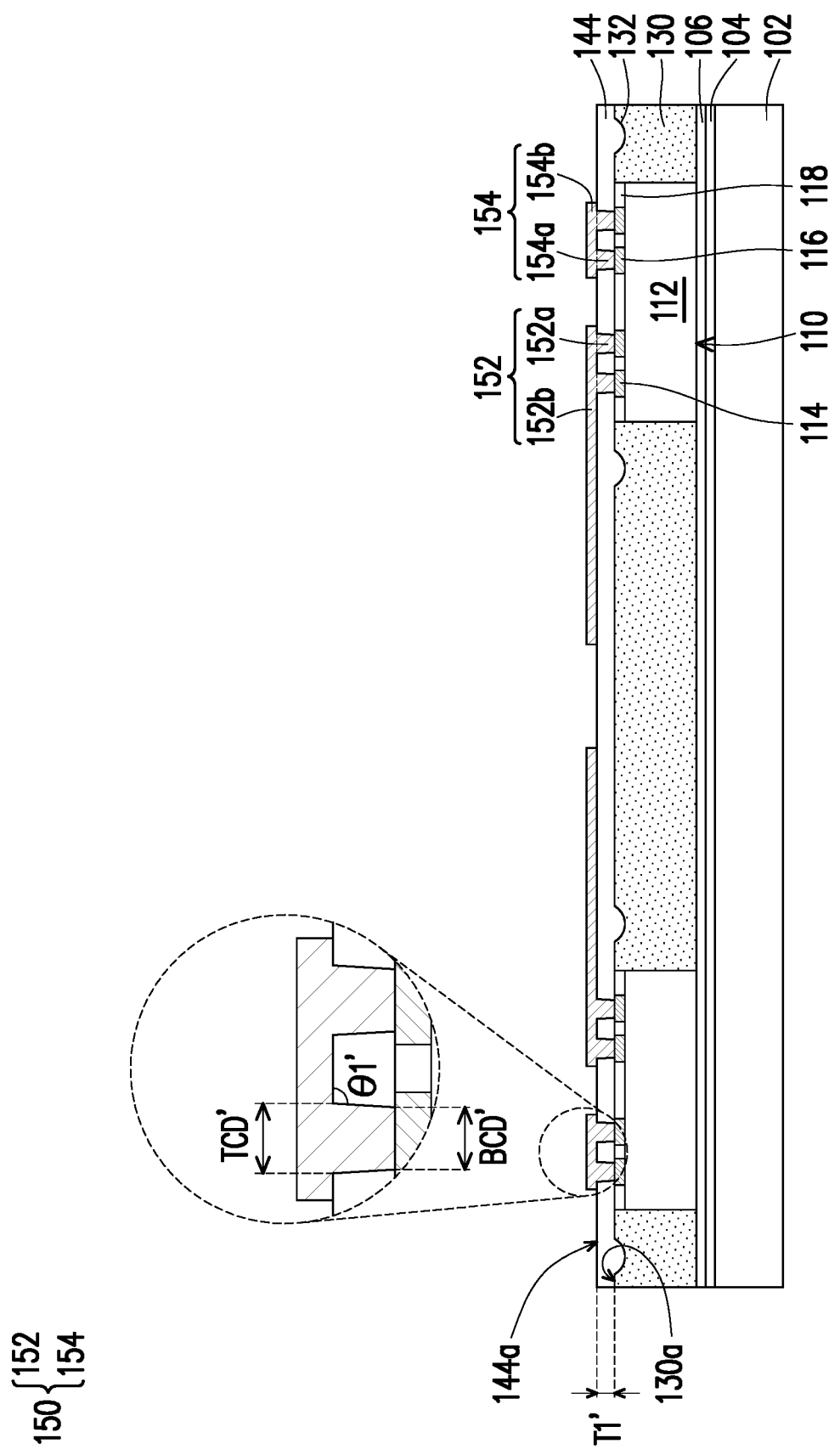

Referring to FIG. 1D, a redistribution layer 150 is formed on the top surface 144a of the first passivation layer 144, to electrically connected to the integrated circuits 110. As shown in FIG. 1D, the redistribution layer 150 includes a plurality of redistribution conductive patterns 152 and a plurality of thermal patterns 154. The redistribution conductive patterns 152 are electrically connected to the conductive connectors 114 embedded in the protection layer 118 for electrical connection. The thermal patterns 154 may be electrically isolated from the redistribution conductive patterns 152 and in direct contact with the thermal patterns 116 for thermal dissipation. In some embodiments, the thermal patterns 154 are also referred to as thermal pads. In some embodiments, materials of the conductive patterns 152 and the thermal patterns 154 are the same or different. The conductive patterns 152 and the thermal patterns 154 may include tungsten, copper, a copper alloy, aluminum, an aluminum alloy or a combination thereof. In some embodiments, the redistribution conductive patterns 152 include a seed layer (not shown) and a conductive layer not shown), and the seed layer is disposed on a bottom of the conductive layer. In some embodiments, the redistribution conductive patterns 152 and the thermal patterns 154 are formed simultaneously separately. The thermal patterns 154 and the redistribution conductive patterns 152 may be disposed at the same level. That is, top surfaces and bottom surfaces of the thermal patterns 154 may be substantially flush with top surfaces and bottom surfaces of the redistribution conductive patterns 152 respectively.

In some embodiments, the redistribution conductive patterns 152 have conductive vias 152a in the openings 146 and conductive lines 152b on the first passivation layer 144. The conductive line 152b is electrically connected to the conductive via 152a. In some embodiments, the conductive via 152a and the conductive line 152b are integrally formed. In some alternative embodiments, the conductive via 152a and the conductive line 152b are formed separately. In some embodiments, the conductive via 152a of the redistribution conductive pattern 152 has a sharp profile, that is, the conductive via 152a has a substantially vertical sidewall. For example, an included angle θ1' formed between the top surface 144a of the first passivation layer 144 and the sidewall of the conductive via 152a is in a range of about 90 degrees to about 95 degrees, and a difference between a top critical dimension TCD' and a bottom critical dimension BCD' of the conductive via 152a is less than 0.5 μm. Accordingly, more space is allowed for routing and/or an overlay window is enlarged. In some embodiments, a thickness of the conductive via 152a is in a range of 2.5 μm to 4.5 μm, and a thickness of the conductive line 152b is in a range of 1 μm to 2 μm. In some embodiments, since the first passivation layer 144 has a substantially flat surface, the conductive line 152b of the redistribution conductive patterns 152 extending over the first passivation layer 144 is prevented from being broken. Accordingly, the performance of the redistribution layer 150 may be improved. In some embodiments, the thermal pattern 154 have a thermal via 154a in the opening 146 and a thermal pad 154b on the first passivation layer 144. The thermal pad 154b may connect a plurality of thermal vias 154a. The structure of the thermal via 154a may be similar to those of the conductive via 152a. However, the disclosure is not limited thereto. In addition, the redistribution conductive patterns 152 and the thermal pattern 154 may have any other suitable structure.

Figure 1E:
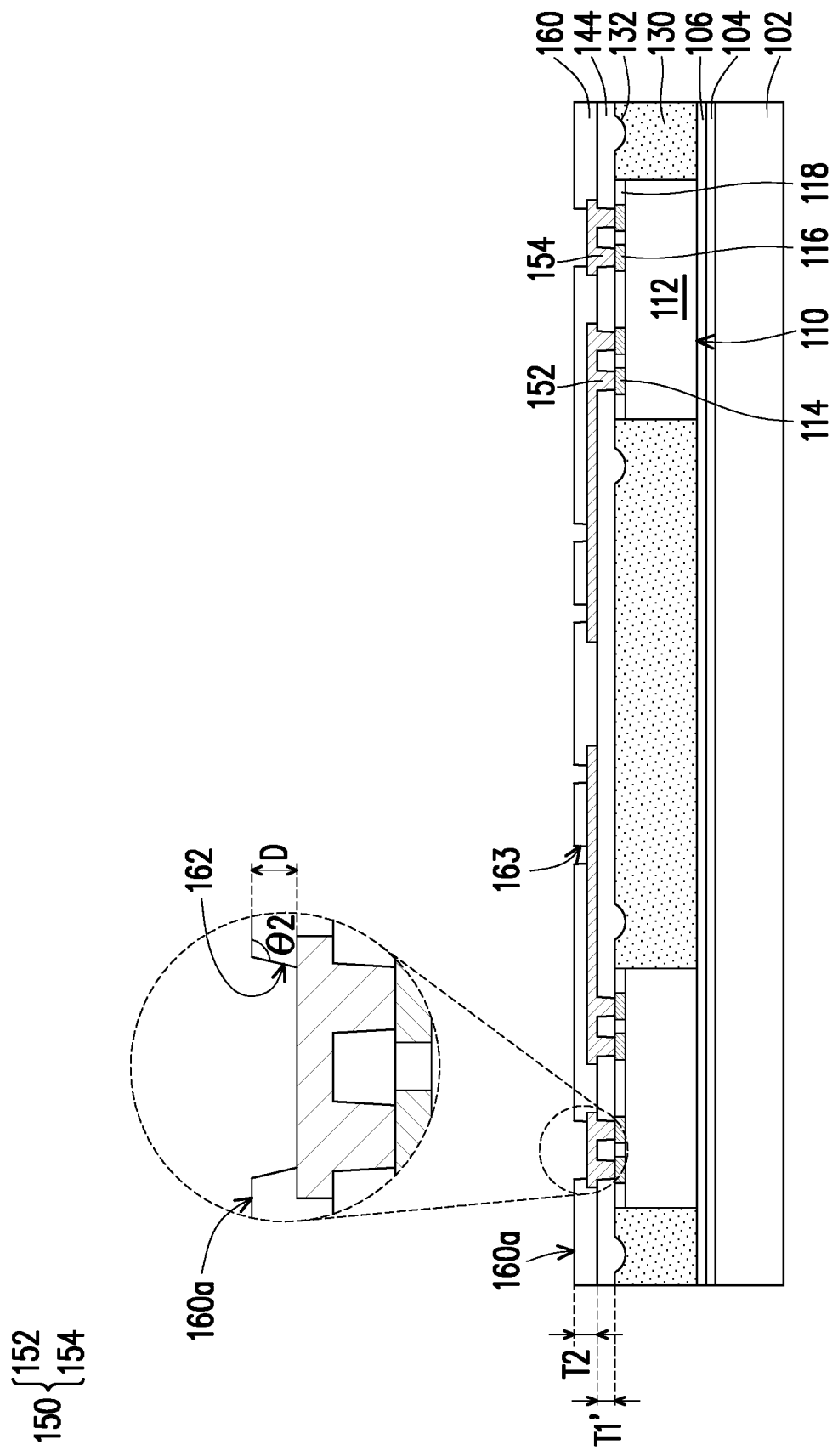

Referring to FIG. 1E, a second passivation material 160 is formed over the redistribution layer 150. In some embodiments, the second passivation material 160 includes a dielectric material such as polybenzoxazole, polyimide, benzocyclobutene, a combination thereof, or other suitable electrically insulating materials. In some embodiments, a thickness T2 of the second passivation material 160 is in a range of 3 μm to 6 μm. Then, a plurality of openings 162 are formed in the second passivation material 160. The openings 162 has a depth D in a range of 2 μm to 4 μm. In some embodiments, a width of the openings 162 is in a range of about 5 μm to about 100 μm. In some embodiments, the opening 162 has a rounding profile. For example, an included angle θ2 formed between a top surface 160a of the second passivation material 160 and a sidewall of the opening 162 is larger than or equal to about 100 degrees. A difference between a top critical dimension and a bottom critical dimension of the opening 162 is larger than 2 μm. In some embodiments, a plurality of openings 163 are formed in the second passivation material 160, to expose portions of the redistribution conductive pattern 152.

Figure 1F:
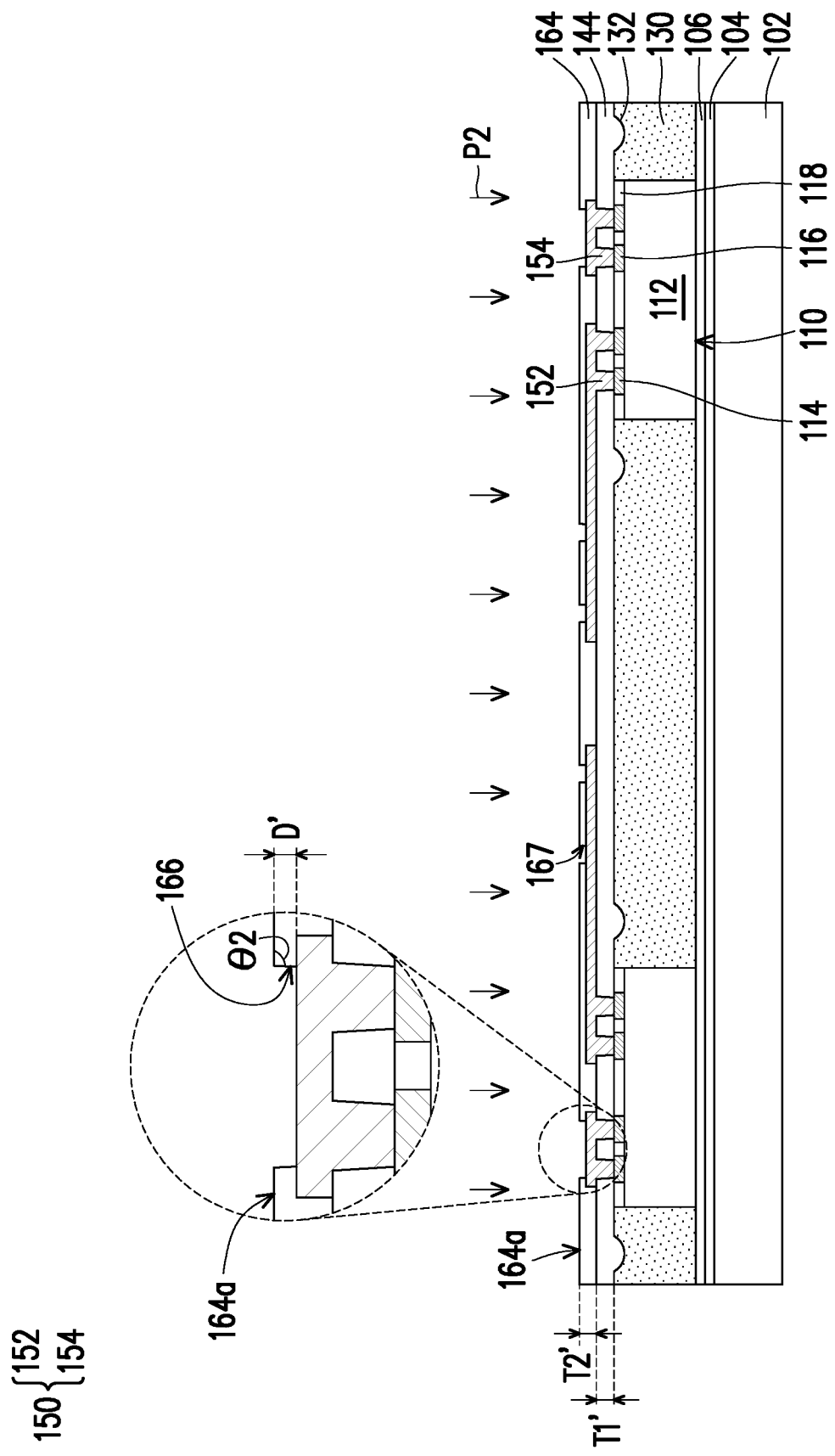

Referring to FIG. 1F, a second planarization process P2 is performed on the second passivation material 160 to remove portions of the second passivation material 160, so as to form a second passivation layer 164 and a plurality of openings 166, 167. In some embodiments, the second planarization process P2 is chemical mechanical polishing (CMP) process or other suitable planarization process. The second planarization process P2 may remove more than ½ of thickness T2 of the second passivation material 160. For example, after performing the second planarization process P2, the second passivation layer 164 has a thickness T2' in a range of 0.5 μm to 2 μm, and the openings 166 has a depth D' in a range of 1 μm to 2 μm. In some embodiments, the second passivation layer 164 has a thickness T2' not larger than 1 μm. In some embodiments, after performing the second planarization process P2, the opening 166 has more vertical sidewalls. For example, an included angle θ2' formed between the top surface 164a of the first passivation layer 164 and a sidewall of the opening 166 is in a range of about 90 degrees to about 95 degrees, and a difference between a top critical dimension TCD' and a bottom critical dimension BCD' of the opening 166 is less than 0.5 μm.

Figure 1G:
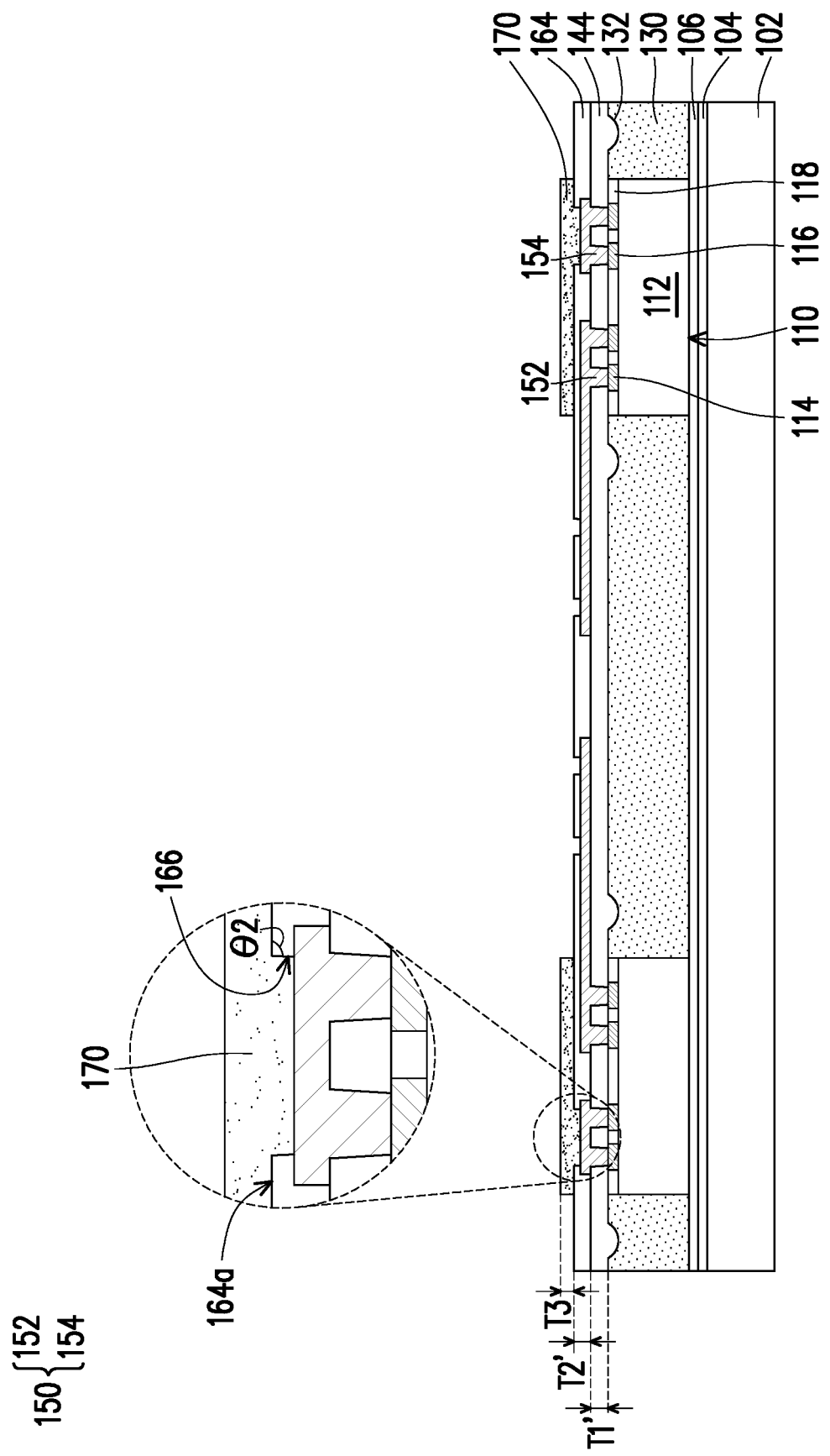

Referring to FIG. 1G, an adhesive layer 170 is formed over the second passivation layer 164 and fills the opening 166. In some embodiments, the adhesive layer 170 is formed on the second passivation layer 164. The adhesive layer 170 may be a die attach film (DAF) or other suitable adhesive material. In some embodiments, the adhesive layer 170 includes a polymer such as a resin and fillers in the polymer.

The polymer may include resin, and the fillers may include alumina, silica, or metallic particle. The adhesive layer 170 may have a thermal conductivity higher than 0.2 W/(m·K). In some alternative embodiments, the adhesive layer 170 contains a polymer without fillers. The adhesive layer 170 may be liquid, e.g., a thick liquid, when applied but forms a solid at room temperature, and may become semi-liquid when heated and may become sticky to function as an adhesive at elevated temperatures. In some embodiments, due to the second planarization process P2, the depth D' of the openings 166 of the second passivation layer 164 is smaller than the depth D of the openings 162 of the second passivation material 160. Thus, the openings 166 may be completely filled by the adhesive layer 170 without voids. That is, compared to completely filling the deeper openings (i.e., openings 162 having a depth D), completely filling the openings 166 having a smaller depth D (i.e., smaller topography) may be easier and thus the thickness of the adhesive layer 170 may be reduced. For example, a thickness T3 of the adhesive layer 170 laminated on the second passivation layer 164 is in a range of 4 µm to 6 µm. A ratio of the thickness T3 of the adhesive layer 170 to the thickness T1' of the first passivation layer 144 may be larger than 2, 2.5 or 2.8. A ratio of the thickness T3 of the adhesive layer 170 to the thickness T2' of the second passivation layer 164 may be larger than 2, 2.5 or 2.8. In some embodiments, a ratio of the thickness T3 of the adhesive layer 170 to the thickness T1' of the first passivation layer 144 is equal to or larger than about 5. In some embodiments, a ratio of the thickness T3 of the adhesive layer 170 to the thickness T2' of the second passivation layer 164 is equal to or larger than about 5. Due to the reduced thickness T3, the adhesive layer 170 may have a thermal conductivity higher than 0.2 W/(m·K), so as to improve the thermal dissipation. In some embodiments, the adhesive layer 170 is partially disposed in the opening 166 of the second passivation layer 164 to contact with the thermal pattern 154. In some embodiments, an included angle θ2' formed between the top surface 164a of the second passivation layer 164 and a sidewall of a portion of the adhesive layer 170 in the second passivation layer 164 is in a range of about 90 degrees to about 95 degrees. In some embodiments, the thermal path is formed by the adhesive layer 170, the opening 166 of the second passivation layer 164 and the thermal pattern 154, that is, the heat is dissipated through the adhesive layer 170, the opening 166 of the second passivation layer 164 and the thermal pattern 154.

Figure 1H:
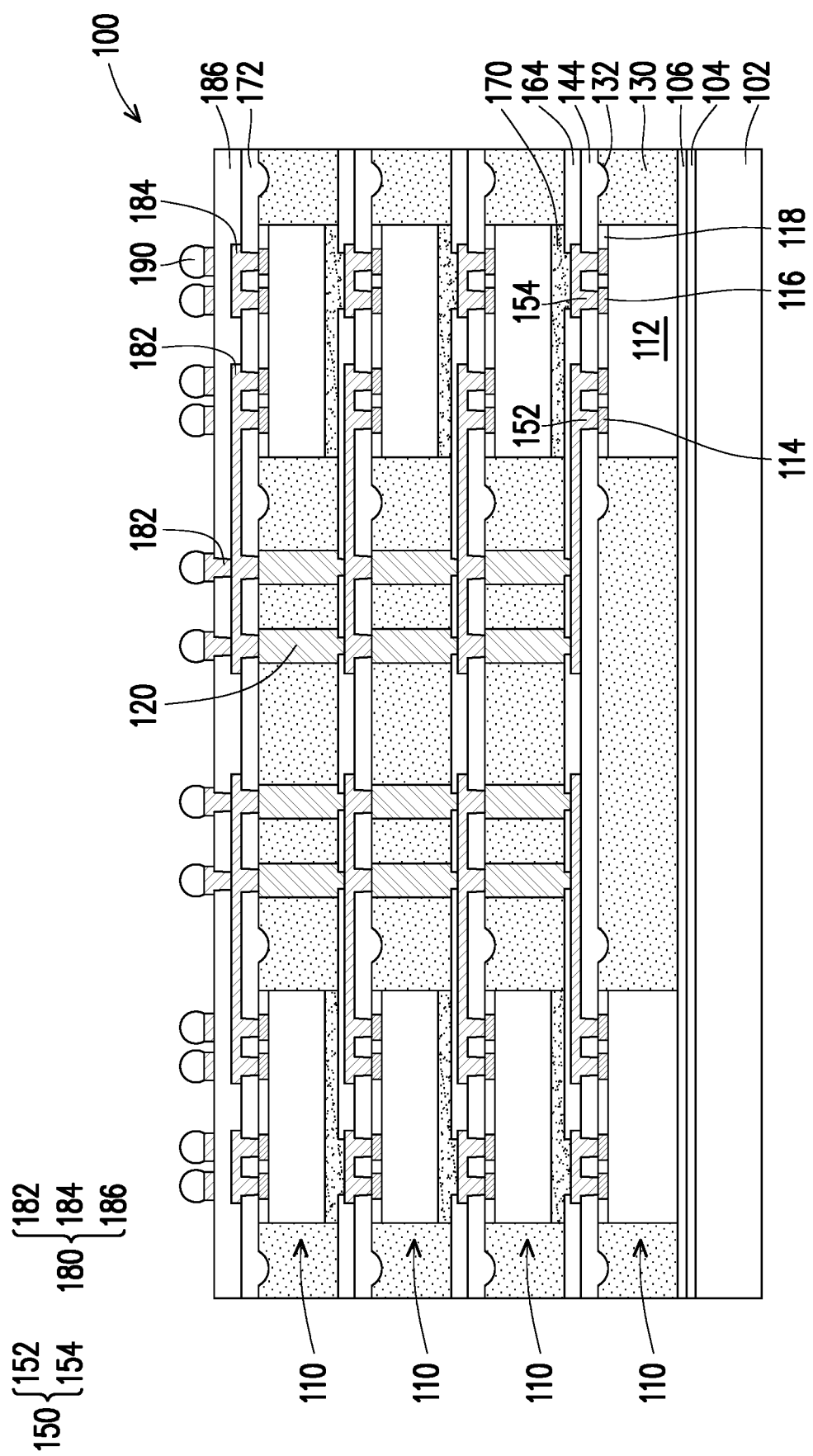

Referring to FIG. 1H, an integrated circuit 110 is stacked onto the integrated circuit 110 through the adhesive layer 170. In some embodiments, the integrated circuit 110 is picked and placed on the adhesive layer 170, so as to adhere to the integrated circuit 110. Sidewalls of the adhesive layer 170 may be substantially flush with of sidewalls of the integrated circuit 110. Then, a first passivation layer 144, a redistribution layer 150, a second passivation layer 164 and an adhesive layer 170 are sequentially formed over the integrated circuit 110, and the forming methods thereof are substantially the same as or similar to those described before. In some embodiments, the integrated circuits 110 are different types or the same types of dies.

In some embodiments, a plurality of through interlayer vias (TIVs) 120 are formed between the integrated circuits 110. The TIVs 120 may be formed before or after providing the integrated circuits 110. The TIVs 120 are electrically connected to the integrated circuits 110 through the redistribution layer 150. For example, the TIVs 120 are disposed in the openings 167 to electrically connect to the redistribution conductive patterns 152. In some embodiments, the TIVs 120 are also electrically connected to the integrated circuits 110 through the redistribution layer 150. In some embodiments, the TIVs 120 are disposed on and electrically connected to the redistribution conductive patterns 152.

Then, an encapsulant 130 is formed to encapsulate the integrated circuits 110 and the TIVs 120. The forming method and material of the encapsulant 130 are similar to those described before. In some embodiments, a surface of the encapsulant 130 may be substantially coplanar with surfaces (e.g., the front surface) of the integrated circuits 110 and the TIVs 120.

In some embodiments, at least one integrated circuit 110 is sequentially stacked on the integrated circuit 110, to form a semiconductor package 100. In some embodiments, the semiconductor package 100 includes a plurality of stacks. The structure of redistribution layers 150 and adhesive layers 170 between the integrated circuits 110 are substantially the same as or similar to those described before. A plurality of TIVs 120 may be formed between the side-by-side integrated circuits 110, and an encapsulant 130 may be formed to encapsulate the TIVs 120 and the integrated circuits 110. In some embodiments, sidewalls of the integrated circuits 110 are substantially aligned with one another and misaligned with sidewalls of the integrated circuit 110 therebeneath. However, the disclosure is not limited thereto. In some alternative embodiments, the sidewalls of the integrated circuits 110 are not aligned with one another. In some alternative embodiments, the sidewalls of the integrated circuits 110 are aligned with the sidewalls of the integrated circuit 110 therebeneath.

Then, a passivation layer 172 may be formed over the topmost integrated circuits 110, and a redistribution layer 180 and a plurality of connectors 190 may be sequentially formed on the passivation layer 172. The forming method and material of the passivation layer 172 may be the same as or similar to the forming method and material of the first passivation layer 144. The redistribution layer 180 may include a plurality of redistribution conductive pattern 182, a plurality of thermal patterns 184 and a passivation layer 186 aside the redistribution conductive pattern 182 and the thermal patterns 184. In some embodiments, the redistribution conductive pattern 182 are electrically connected to the conductive patterns 114, and thermal patterns 184 are thermally connected to the thermal patterns 116. The connectors 190 are electrically connected to the redistribution conductive pattern 182. In some embodiments, the connectors 190 may be micro bumps, which may include copper posts and may be called copper post (or pillar) bumps, but the disclosure is not limited thereto.

Figure 1I:
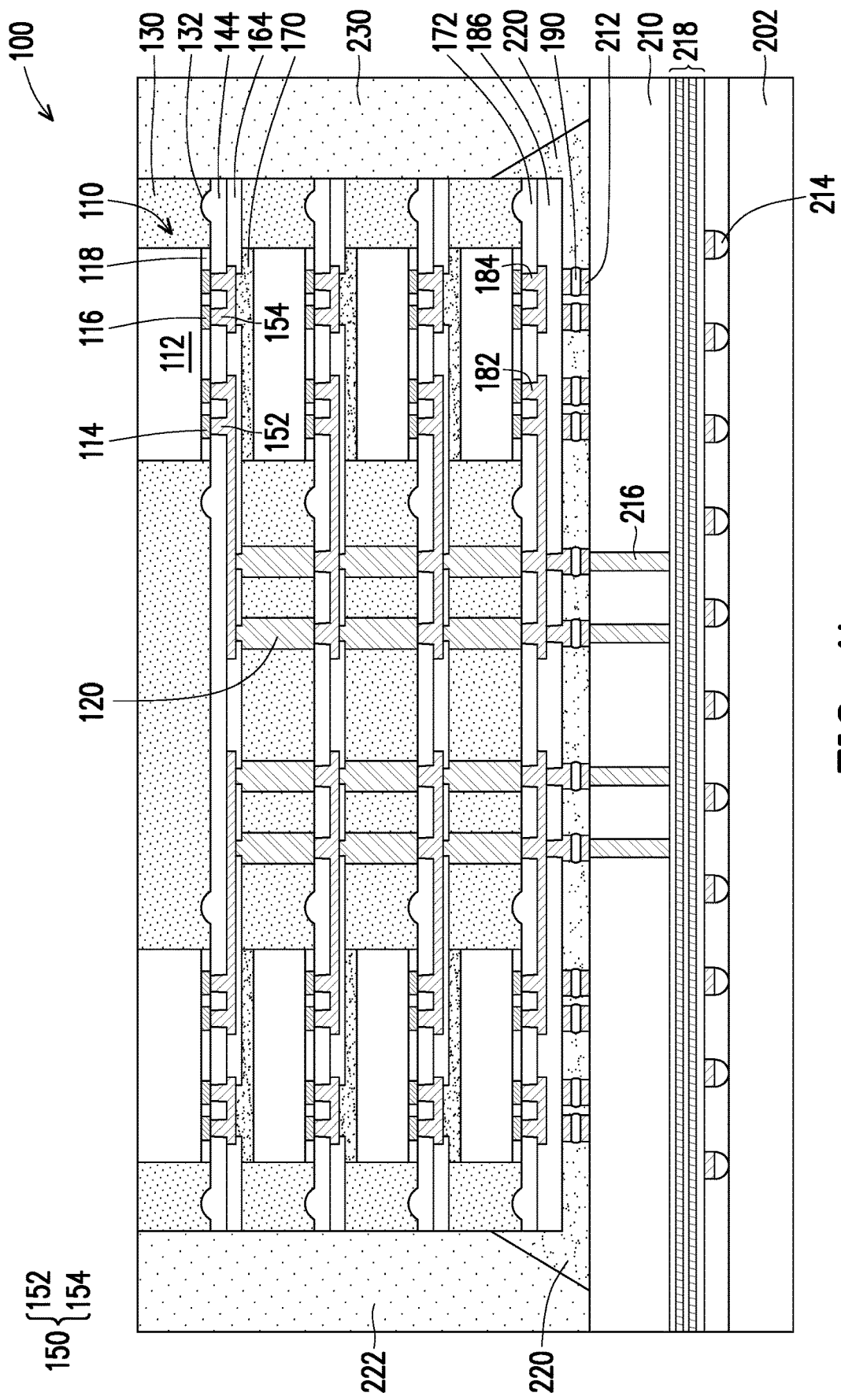

Referring to FIG. 1I, the structure of FIG. 1H is de-bonded from the temporary carrier 102, and bonded to an integrated circuit 210 over a temporary carrier 202. That is, the temporary carrier 102, the de-bonding layer 104 and the adhesive layer 106 are removed. In some embodiments, the de-bonding layer 104 (e.g., the LTHC release layer) is irradiated by an UV laser. The semiconductor package 100 is connected and/or stacked with other electronic devices. In some embodiments, the integrated circuit 210 is a logic die, such as a central processing unit (CPU) die, a graphic processing unit (GPU) die, a micro control unit (MCU) die, an input-output (I/O) die, a baseband (BB) die, or an application processor (AP) die. The integrated circuit 210 and the integrated circuit 110 may be the same type of dies or different types of dies. In some embodiments, the integrated circuit 210 is an active component or a passive component. The integrated circuit 210 may be also referred to as a base die. The integrated circuit 210 may have a plurality of connectors 212 on a first surface thereof and a plurality of connectors 214 on a second surface opposite to the first surface. The integrated circuit 210 may include a plurality of through substrate vias 216 and a redistribution layer 218 between the first surface and the second surface, to electrically connect the connectors 212 and the connectors 214. In some embodiments, the semiconductor package 100 is bonded to the integrated circuit 210 through the connectors 190 and the connectors 212. Then, an underfill 220 may be formed aside the connectors 190 and the connectors 212. In some embodiments, the semiconductor package 100 and the integrated circuit 210 are face-to-back bonded, in which the semiconductor package 100 has its front surface facing a back surface of the integrated circuit 210. In some alternative embodiments, the semiconductor package 100 is integrated with flip chip package, a chip on wafer on substrate package (CoWoS) or an integrated fan-out (InFO) package.

Figure 1J:
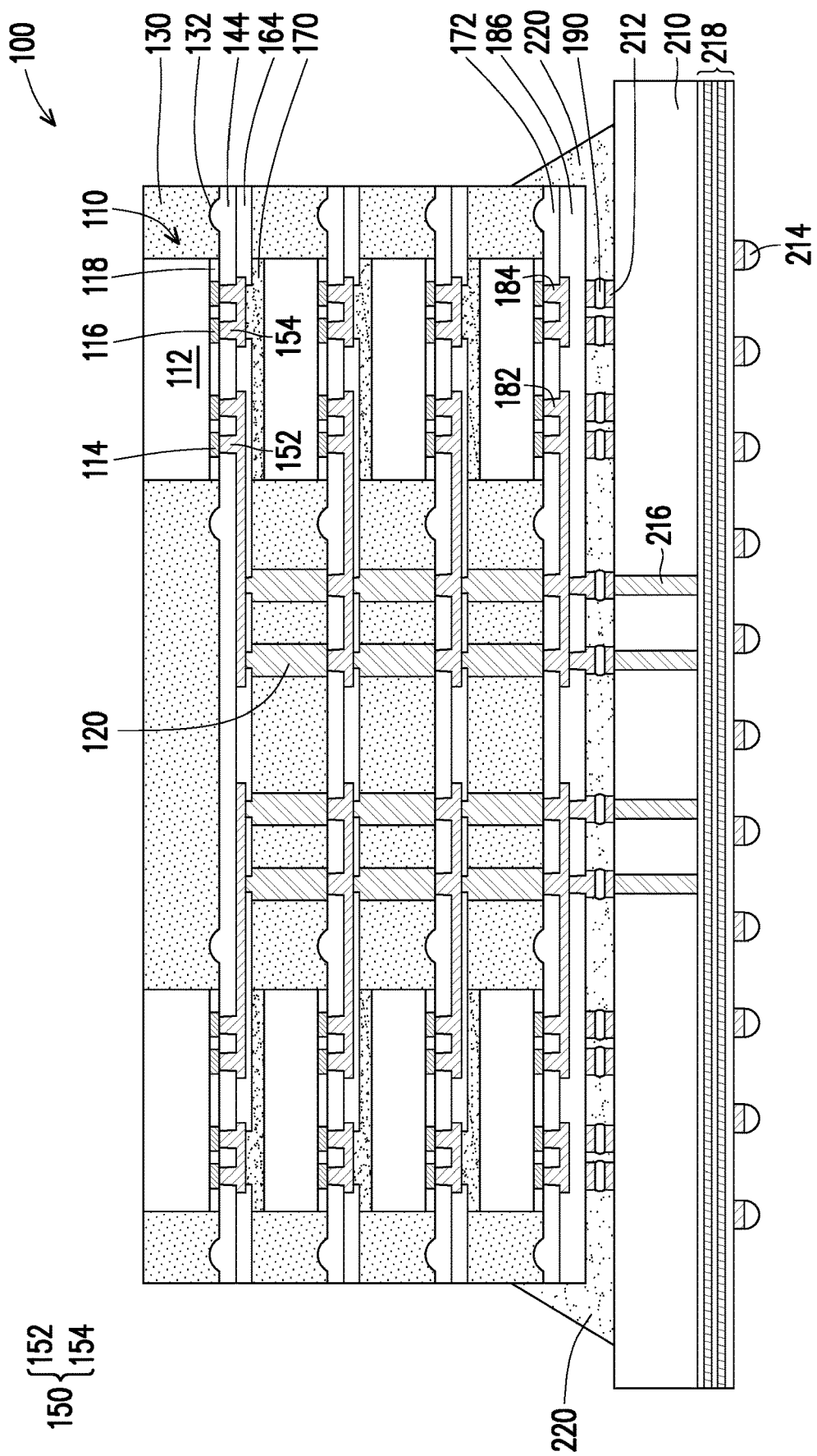

Referring to FIG. 1J, the structure of FIG. 1I de-bonded from the temporary carrier 202. Before performing the singulation process, an encapsulating material is formed to encapsulate the semiconductor package 100 and the integrated circuit 210, so as to form an encapsulant 222. In some embodiments, the structure of FIG. 1I is singulated into a plurality of semiconductor packages 10 by a singulation process. The singulation process is sawing, laser ablation, etching, a combination thereof, or the like.

Figure 2:
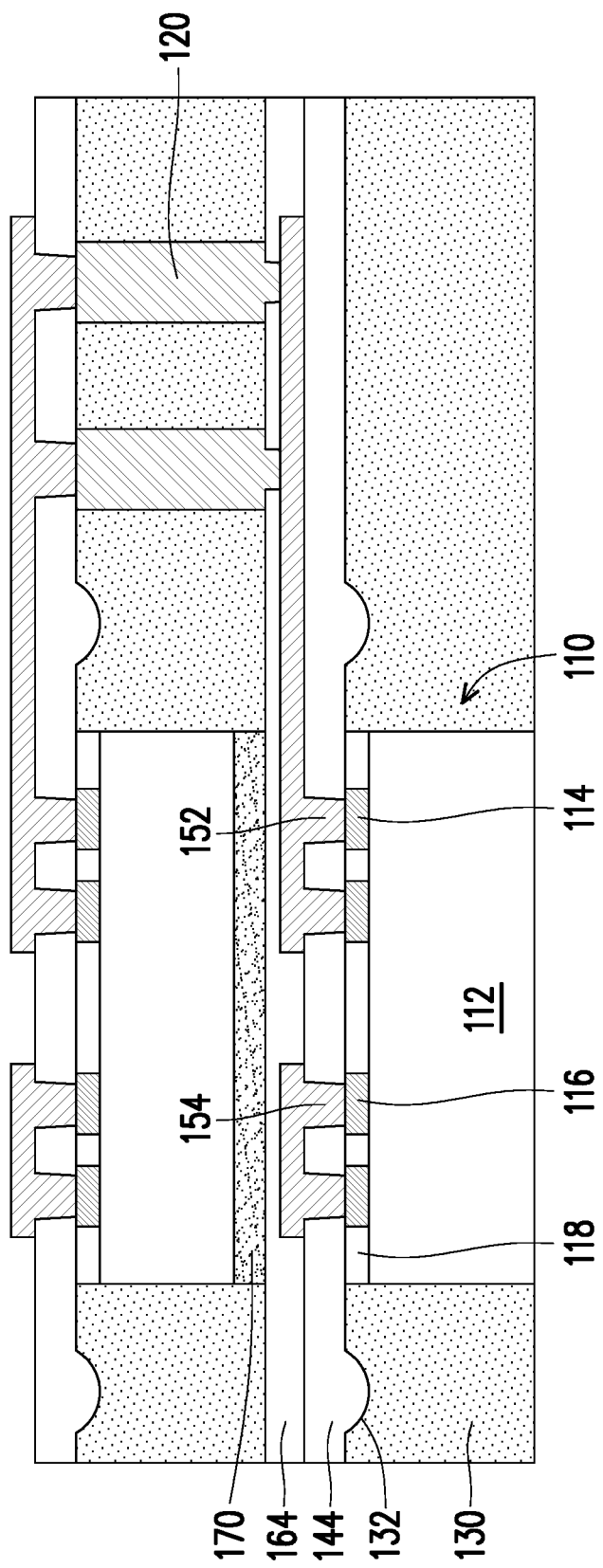
FIG. 2 is a partial view of a semiconductor package according to some embodiments.
Figure 3:
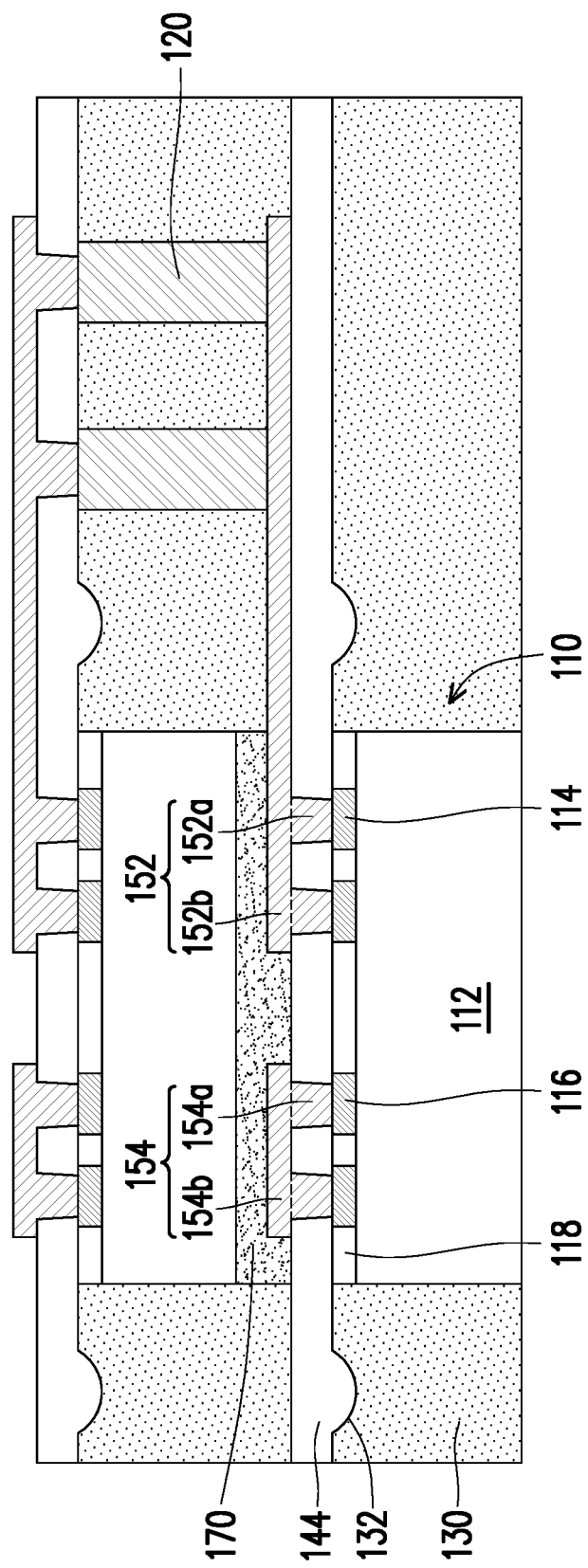
FIG. 3 is a partial view of a semiconductor package according to some embodiments.

In some embodiments, the adhesive layer 170 is partially disposed in the opening 166 of the second passivation layer 164 to contact with the thermal pattern 154. However, the disclosure is not limited thereto. For example, as shown in FIG. 2, the adhesive layer 170 is directly disposed on a surface (i.e., a flatten surface) of the second passivation layer 164, and the second passivation layer 164 is disposed between the adhesive layer 170 and the thermal pattern 154. In such embodiments, the thermal path is formed by the adhesive layer 170, the second passivation layer 164 and the thermal pattern 154, that is, the heat is dissipated through the adhesive layer 170, the second passivation layer 164 and the thermal pattern 154. In some alternative embodiments, as shown in FIG. 3, the adhesive layer 170 is formed on and in direct contact with the thermal pattern 154 and the redistribution conductive pattern 152. The thermal pattern 154 and the redistribution conductive pattern 152 may be partially embedded in the adhesive layer 170. The adhesive layer 170 may enclose tops and sidewalls of the thermal pattern 154 and the redistribution conductive pattern 152. For example, the thermal pad 154b of the thermal pattern 154 and the conductive line 152b of the redistribution conductive patterns 152 are embedded in the adhesive layer 170. In some embodiments, the adhesive layer 170 is in direct contact with the thermal pattern 154 and the redistribution conductive pattern 152 and disposed between the thermal pattern 154 and the redistribution conductive pattern 152. In such embodiments, the thermal path is formed by the adhesive layer 170, the thermal pattern 154 and the redistribution conductive pattern 152, that is, the heat is dissipated through the adhesive layer 170, the thermal pattern 154 and the redistribution conductive pattern 152.

Figure 4:
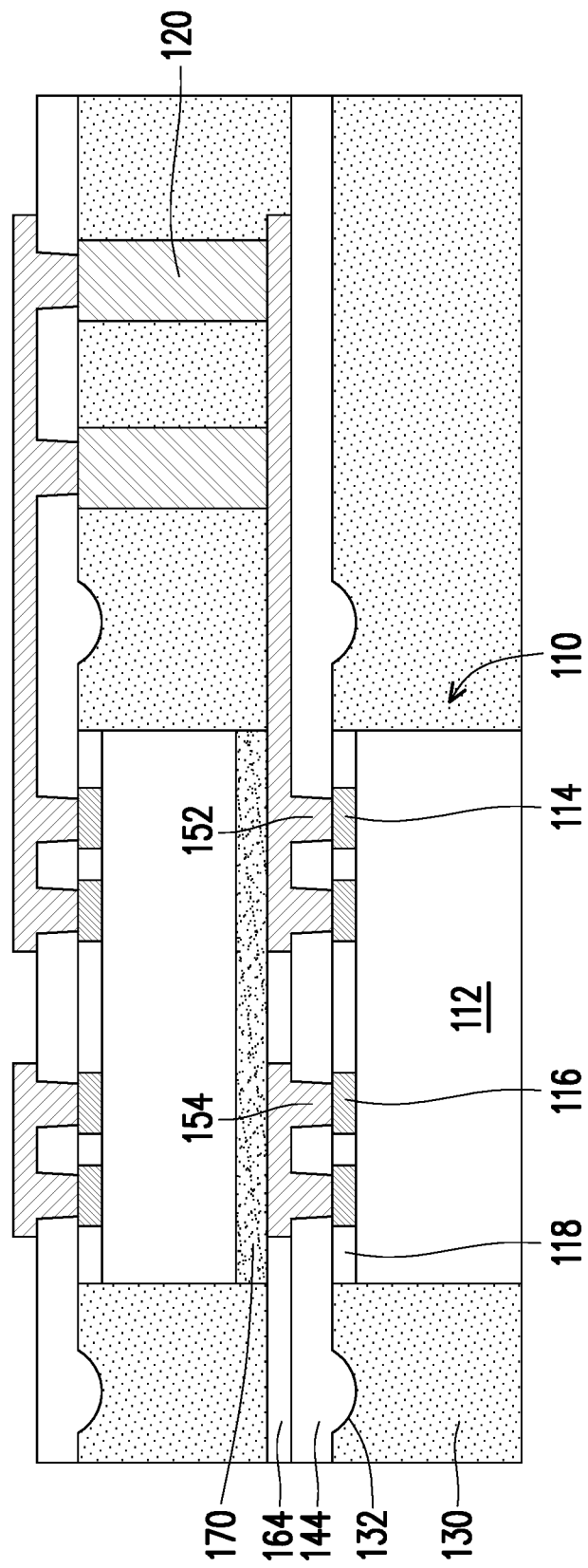
FIG. 4 is a partial view of a semiconductor package according to some embodiments.

In some alternative embodiments, as shown in FIG. 4, the second passivation layer 164 is disposed between the redistribution conductive pattern 152 and the thermal pattern 154 without covering the redistribution conductive pattern 152 and the thermal pattern 154. For example, after forming the redistribution conductive pattern 152 and the thermal pattern 154, the second passivation material is formed over the redistribution conductive pattern 152 and the thermal pattern 154 to cover the redistribution conductive pattern 152 and the thermal pattern 154 and fills gaps between the redistribution conductive pattern 152 and the thermal pattern 154. Then, a planarization process is performed on the second passivation material to form the second passivation layer 164 until surfaces of the thermal pattern 154, the redistribution conductive pattern 152 and the second passivation layer 164 are substantially coplanar. After that, the adhesive layer 170 is formed on the thermal pattern 154, the redistribution conductive pattern 152 and the second passivation layer 164. In some embodiments, a bottom surface of the adhesive layer 170 is substantially flush with and in direct contact with the top surfaces of the thermal pattern 154, the redistribution conductive pattern 152 and the second passivation layer 164. In addition, the encapsulant 130 may be directly formed on and in direct contact with the redistribution conductive pattern 152, and a bottom surface of the encapsulant 130 may be substantially flush with the top surfaces of the thermal pattern 154, the redistribution conductive pattern 152 and the second passivation layer 164. In such embodiments, the thermal path is formed by the adhesive layer 170, the thermal pattern 154 and the redistribution conductive pattern 152, that is, the heat is dissipated through the adhesive layer 170, the thermal pattern 154 and the redistribution conductive pattern 152.

Figure 5:
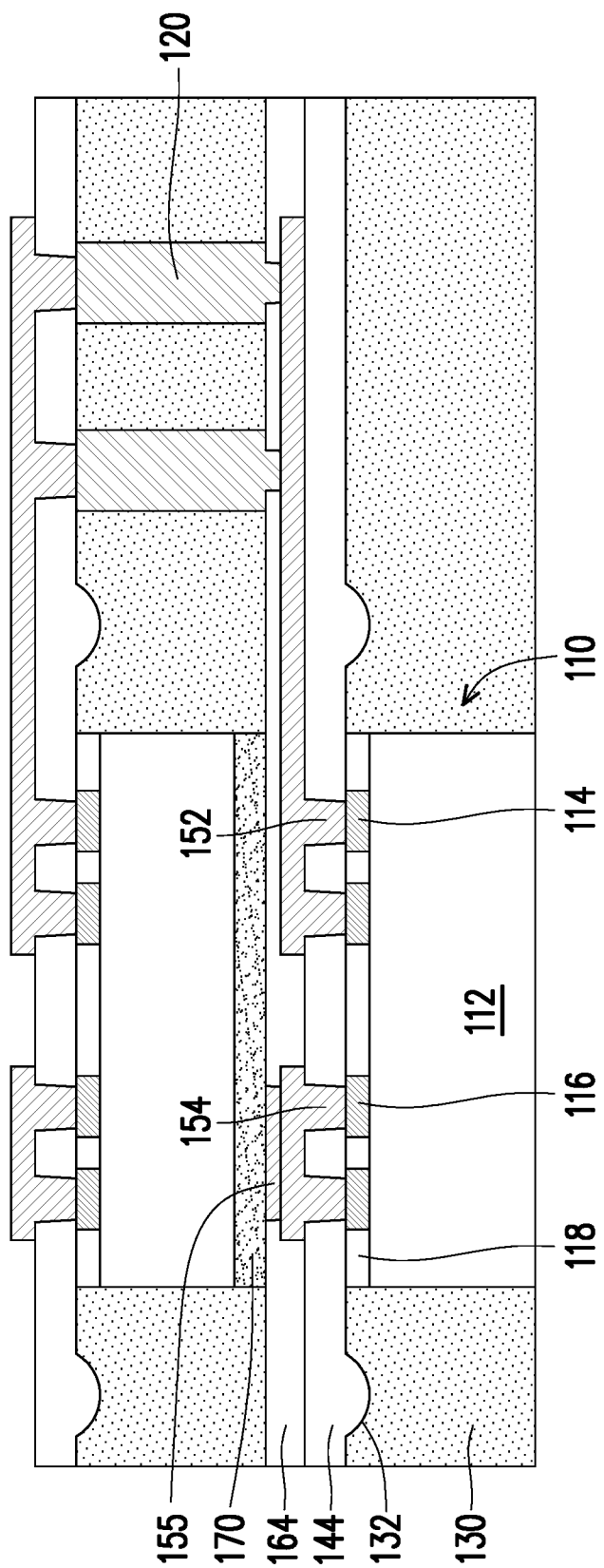
FIG. 5 is a partial view of a semiconductor package according to some embodiments.

In some embodiments, as shown in FIG. 5, the structure is similar to the structure of FIG. 2. The main difference lies in a thermal pattern 155 is further disposed in the second passivation layer 164 between the thermal pattern 154 and the adhesive layer 170 to connect the thermal pattern 154 and the adhesive layer 170. In some embodiments, the adhesive layer 170 is entirely over a surface of the second passivation layer 164, and a surface of the thermal pattern 154 is substantially flush with the surface of the second passivation layer 164. In such embodiments, the thermal path is formed by the adhesive layer 170, the thermal pattern 155, the thermal pattern 154 and the redistribution conductive pattern 152, that is, the heat is dissipated through the adhesive layer 170, the thermal pattern 155, the thermal pattern 154 and the redistribution conductive pattern 152. In some embodiments, the thermal pattern 155 is a thermal via. The thermal pattern 155 may be formed simultaneously with the redistribution conductive pattern 152 (for example, the redistribution conductive pattern 152 between the TIVs 120). In some embodiments, the thermal pattern 155 is formed before forming the second passivation layer 164 by an ultra-high density (UHD) process. For example, the thermal pattern 155 is formed on the thermal pattern 154, and then a second passivation material is formed to cover the thermal pattern 155. After that, a planarization process (i.e., a second planarization process) is performed on the second passivation material to form the second passivation layer 164 until a surface of the thermal pattern 155 is exposed. In some embodiments, surfaces of the thermal pattern 155, the redistribution conductive pattern 152 and the second passivation layer 164 are substantially coplanar. After that, the adhesive layer 170 is formed on the thermal pattern 155 and the second passivation layer 164.

Figure 6:
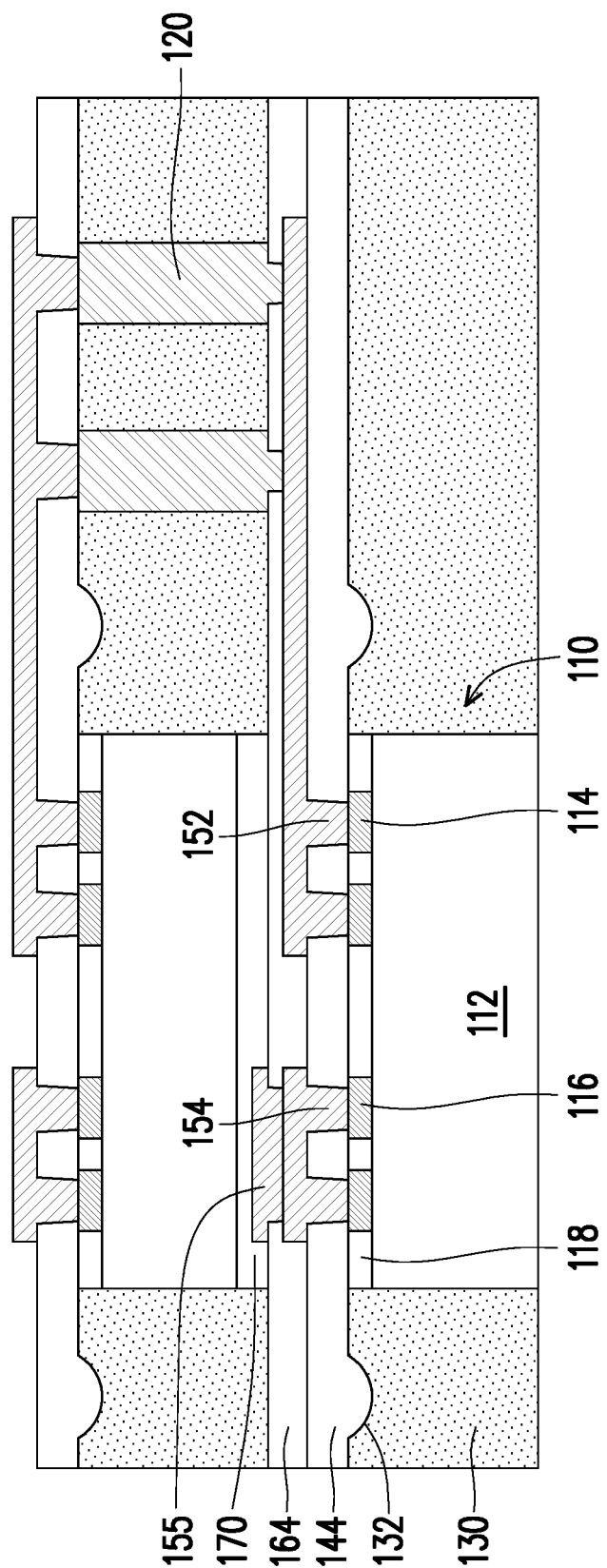
FIG. 6 is a partial view of a semiconductor package according to some embodiments.

In some embodiments, as shown in FIG. 6, a thermal pattern 155 is partially formed in and partially formed over the second passivation layer 164 to thermally connect the thermal pattern 154 and the adhesive layer 170. For example, the thermal pattern 155 includes a thermal via in the second passivation layer 164 and a thermal pad on the thermal via. The thermal pattern 155 may be formed simultaneously with the redistribution conductive pattern 152 in the second passivation layer 164 (for example, the redistribution conductive pattern 152 between the TIVs 120). The thermal pattern 155 may be partially embedded in the adhesive layer. In such embodiments, the thermal path is formed by the adhesive layer 170, the thermal pattern 155, the thermal pattern 154 and the redistribution conductive pattern 152, that is, the heat is dissipated through the adhesive layer 170, the thermal pattern 155, the thermal pattern 154 and the redistribution conductive pattern 152. In some embodiments, a thinning process is performed on the second passivation layer 164 to achieve better thermal efficiency due to shorter dissipation path. However, the disclosure is not limited thereto.

In the embodiments of FIGS. 2-6, filling the opening 166 in the second passivation layer 164 by the adhesive layer 170 is not required, and thus void is prevented from being formed in the adhesive layer 170. In addition, it is noted that although one or two passivation layers (i.e., the first passivation layer 144 and the second passivation layer 164) and one or two layers of the thermal patterns (i.e., the thermal patterns 154 and the thermal patterns 155 are illustrated, there may be any number of passivation layer and/or the thermal patterns.

In some embodiments, the first and second passivation layers are formed by a planarization process followed by a deposition process, and thus the first and second passivation layers have a flat surface and a reduced thickness respectively. Accordingly, a fine-pitch line (for example, L/S=1.4 μm/1.4 μm) of the redistribution layer formed on the first passivation layer may be prevented from being broken, and the semiconductor package may have a good uniformity across the surface (for example, a thickness variation within the passivation layer of the wafer is less than +/−0.5 μm). In addition, the depth of the opening in the second passivation layer is also reduced, and thus the adhesive layer may be formed over the second passivation layer without voids and have a small thickness, which improves the yield and enlarges material selections. For example, a high-K adhesive layer is adopted to improve thermal dissipation. In some embodiments, thermal dissipation of the semiconductor package is improved due to the thickness reduction of the first and second passivation layers and the adhesive layer. In some embodiments, the second passivation layer or the opening in the second passivation layer is omitted, and thus filling the opening by the adhesive layer is not required. Accordingly, formation of the void in the second passivation layer may be also prevented. In addition, since the thickness of the first and second passivation layers and the adhesive layer is reduced, the semiconductor package may have a reduce total thickness. In addition, the integrated circuit serving as a core die may have a lager height and the TIV may have a smaller height, so as to reduce the strain at TIV region (for example, the strain at TIV region of the die disposed opposite to the core die). Accordingly, the reliability of the semiconductor package may be improved.

In accordance with some embodiments of the disclosure, a semiconductor package includes a first integrated circuit, a first passivation layer, a second passivation layer, a thermal pattern, an adhesive layer and a second integrated circuit. The first integrated circuit is encapsulated by an encapsulant. The first passivation layer is disposed over the first integrated circuit and the encapsulant. The second passivation layer is disposed over the first passivation layer. The thermal pattern is disposed in the first passivation layer and the second passivation layer. The adhesive layer is disposed over the second passivation layer and in direct contact with the thermal pattern. The second integrated circuit is adhered to the first integrated circuit through the adhesive layer.

In accordance with some embodiments of the disclosure, a semiconductor package includes a first integrated circuit, a passivation layer, a second thermal pattern, a redistribution conductive pattern, an adhesive layer and a second integrated circuit. The first integrated circuit is encapsulated by a first encapsulant and includes a first thermal pattern and a conductive pattern. The passivation layer is disposed over the first integrated circuit. The second thermal pattern and the redistribution conductive pattern are disposed in the passivation layer. The adhesive layer is disposed over the passivation layer and in direct contact with the second thermal pattern and the redistribution conductive pattern. The second integrated circuit is stacked over the first integrated circuit through the adhesive layer and encapsulated by a second encapsulant.

In accordance with some embodiments of the disclosure, a method of manufacturing a semiconductor package includes the following steps. An encapsulant is formed to encapsulate a first integrated circuit, and the first integrated circuit includes a first thermal pattern. A first passivation material is formed over the encapsulant and the first integrated circuit, and the first passivation material includes at least one first opening to expose the first thermal pattern. A first planarization process is performed on the first passivation material including the at least one first opening, to form a first passivation layer. A second thermal pattern is formed in the at least one first opening of the first passivation layer. A second passivation material is formed, and the second passivation material includes at least one second opening to expose the second thermal pattern. A second planarization process is performed on the second passivation material, to form a second passivation layer. An adhesive layer is formed over the second passivation layer and fills up the at least one second opening. A second integrated circuit is adhered over the first integrated circuit through the adhesive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
 a first integrated circuit encapsulated by an encapsulant;
 a first passivation layer over the first integrated circuit and the encapsulant;
 a thermal pattern in the first passivation layer;
 an adhesive layer over the first passivation layer and in direct contact with the thermal pattern; and
 a second integrated circuit having a first surface, a second surface between the first surface and the first integrated circuit and sidewalls between the first surface and the second surface, wherein the adhesive layer is in direct contact with the second integrated circuit, and the adhesive layer is entirely disposed between the first passivation layer and the second surface of the second integrated circuit, and the second integrated circuit is adhered to the first integrated circuit through the adhesive layer, wherein the first passivation layer is in direct contact with and covers a top surface of the encapsulant facing the second integrated circuit.

2. The semiconductor package according to claim 1, wherein the first passivation layer fills up pits of the encapsulant.

3. The semiconductor package according to claim 1, wherein sidewalls of the adhesive layer are substantially flush with the sidewalls of the second integrated circuit.

4. The semiconductor package according to claim 1, further comprising a second passivation layer between the first passivation layer and the adhesive layer, wherein the second passivation layer is in direct contact with the thermal pattern.

5. The semiconductor package according to claim 1, further comprising a second passivation layer between the first passivation layer and the adhesive layer, wherein the adhesive layer is overlapped with the second passivation layer, and a surface of the thermal pattern is substantially flush with a surface of the second passivation layer.

6. The semiconductor package according to claim 1, wherein a sidewall of the thermal pattern is covered by the adhesive layer.

7. The semiconductor package according to claim 1, further comprising a second passivation layer between the first passivation layer and the adhesive layer, wherein an included angle formed between a top surface of the second passivation layer and a sidewall of a portion of the adhesive layer in the second passivation layer is in a range of about 90 degrees to about 95 degrees.

8. The semiconductor package according to claim 1, wherein the adhesive layer is continuously disposed between the first passivation layer and the second surface of the second integrated circuit.

9. A semiconductor package, comprising:
a first integrated circuit encapsulated by a first encapsulant, comprising a first thermal pattern and a conductive pattern;
a passivation layer over the first integrated circuit;
a second thermal pattern and a redistribution conductive pattern in the passivation layer;
an adhesive layer, disposed over the passivation layer and in direct contact with the second thermal pattern and the redistribution conductive pattern; and
a second integrated circuit, stacked over the first integrated circuit through the adhesive layer and encapsulated by a second encapsulant, wherein the second integrated circuit comprises opposite sidewalls and a surface connecting the opposite sidewalls, the adhesive layer comprises sidewalls substantially flush with the opposite sidewalls of the second integrated circuit, and the adhesive layer is in direct contact with the surface of the second integrated circuit.

10. The semiconductor package according to claim 9, wherein the second thermal pattern and the redistribution conductive pattern are entirely embedded in the adhesive layer.

11. The semiconductor package according to claim 9, wherein surfaces of the second thermal pattern and the redistribution conductive pattern are coplanar with a surface of the passivation layer.

12. The semiconductor package according to claim 9, wherein the passivation layer is in direct contact with the first encapsulant.

13. The semiconductor package according to claim 9, wherein the second encapsulant is in direct contact with the redistribution conductive pattern.

14. The semiconductor package according to claim 9, wherein the second thermal pattern is in direct contact with the first thermal pattern.

15. A semiconductor package, comprising:
a first integrated circuit encapsulated by a first encapsulant;
a first passivation layer over the first integrated circuit and the first encapsulant;
a thermal pattern in the first passivation layer;
a second integrated circuit over the first passivation layer and the first integrated circuit;
an adhesive layer between the first passivation layer and the second integrated circuit; and
a second passivation layer between the first passivation layer and the adhesive layer, wherein the adhesive layer is overlapped with the second passivation layer, the adhesive layer has a surface facing the first integrated circuit, and the surface of the adhesive layer is disposed between top and bottom surfaces of the second passivation layer.

16. The semiconductor package according to claim 15, wherein the adhesive layer is further overlapped with the first passivation layer and the thermal pattern.

17. The semiconductor package according to claim 15, wherein the adhesive layer is entirely disposed over the second passivation layer.

18. The semiconductor package according to claim 15, wherein the second passivation layer is in direct contact with the thermal pattern.

19. The semiconductor package according to claim 15, further comprising a second encapsulant encapsulating the second integrated circuit, wherein the second passivation layer is in direct contact with the second encapsulant.

20. The semiconductor package according to claim 15, wherein the thermal pattern is disposed between the first passivation layer and the second passivation layer in a first direction along which the first passivation layer is disposed over the first integrated circuit, and the thermal pattern is a single piece pattern.

* * * * *